United States Patent
Wakui

(10) Patent No.: US 6,213,443 B1
(45) Date of Patent: Apr. 10, 2001

(54) ANTI-VIBRATION APPARATUS AND EXPOSURE APPARATUS USING THE SAME

(75) Inventor: Shinji Wakui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/299,557

(22) Filed: Apr. 27, 1999

(30) Foreign Application Priority Data

May 7, 1998 (JP) .................................................. 10-139242

(51) Int. Cl.[7] .................................................. F16M 13/00
(52) U.S. Cl. ............................ 248/550; 248/638; 702/56
(58) Field of Search ..................................... 248/550, 562, 248/563, 636, 638, 188.2, 559; 73/662, 663, 664, 665; 364/528.15; 702/56

(56) References Cited

U.S. PATENT DOCUMENTS

| | | | |
|---|---|---|---|
| 5,060,519 | * 10/1991 | Chojitani et al. ....................... | 73/662 |
| 5,478,043 | * 12/1995 | Wakui ................................. | 248/550 |
| 5,812,420 | * 9/1998 | Takahashi ........................... | 364/508 |
| 5,832,620 | * 11/1998 | Yamaguchi et al. .................... | 33/568 |
| 5,931,441 | * 8/1999 | Sakamoto ............................. | 248/550 |

FOREIGN PATENT DOCUMENTS

| | | |
|---|---|---|
| 0 103 188 | * 3/1984 | (EP) . |
| 2522736 | 5/1996 | (JP) . |
| 8-2522736 | 5/1996 | (JP) . |
| 9015868 | * 1/1997 | (JP) . |
| 9-68995 | 3/1997 | (JP) . |
| 9-134876 | 5/1997 | (JP) . |

* cited by examiner

*Primary Examiner*—Hezron Williams
*Assistant Examiner*—Rose M. Miller
(74) *Attorney, Agent, or Firm*—Fitzpatrick, Cella, Harper & Scinto

(57) ABSTRACT

An anti-vibration table having a structure supporting a movable stage is supported by an air spring actuator. The control system of the air spring actuator has a position feedback system for positioning the anti-vibration table at a predetermined equilibrium position on the basis of the position detection signal of the anti-vibration table, an acceleration feedback system for imparting damping characteristics to the anti-vibration table on the basis of the acceleration detection signal of the anti-vibration table, and an applied pressure feedback system for controlling the applied pressure of the air spring actuator. A correction signal for correcting a tilt of the anti-vibration table, which is generated when the stage on the anti-vibration table moves, is generated on the basis of a signal from a laser interferometer for detecting the position of the stage, and feedforward-input to the applied pressure feedback system.

21 Claims, 9 Drawing Sheets

FIG. 4
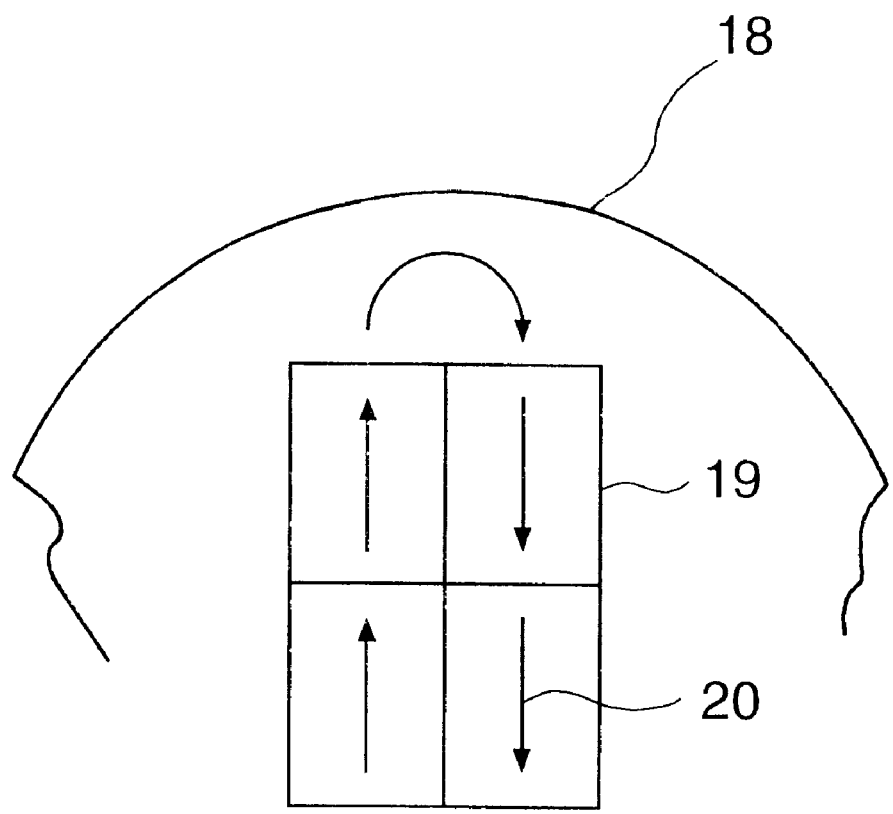
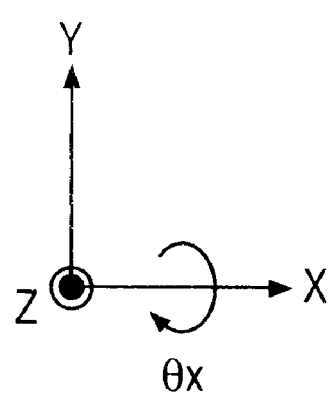

ANTI-VIBRATION APPARATUS AND EXPOSURE APPARATUS USING THE SAME

BACKGROUND OF THE INVENTION

The present invention relates to an active anti-vibration apparatus used for a semiconductor exposure apparatus for printing the circuit pattern of a reticle on a semiconductor wafer, a liquid crystal substrate manufacturing apparatus, or an electron microscope and, more particularly, to an active anti-vibration apparatus capable of suppressing external vibration transmitted to an anti-vibration table and positively canceling vibration generated by precision equipment placed on the anti-vibration table, and an exposure apparatus having the same.

In an electron microscope using an electron beam or a semiconductor exposure apparatus represented by a stepper, an X-Y stage is mounted on an anti-vibration apparatus. This anti-vibration apparatus has a function of attenuating vibration using a vibration absorption means such as an air spring, a coil spring, or an anti-vibration rubber member. Such a passive anti-vibration apparatus can damp vibration transmitted from the floor, though it cannot effectively damp vibration generated by the X-Y stage itself mounted on the apparatus. More specifically, a reaction force generated when the X-Y stage itself moves at a high speed swings the anti-vibration apparatus, and this vibration greatly impedes the positioning settling of the X-Y stage. Additionally, in the passive anti-vibration apparatus, the insulation (anti-vibration) performance for vibration propagating from the floor is a trade off with the suppression (vibration suppression) performance for vibration generated when the X-Y stage itself moves at a high speed. To solve these problems, active anti-vibration apparatuses are widely used A; in recent years. An active anti-vibration apparatus can eliminate a trade off between anti-vibration and vibration suppression within the range of an adjustable mechanism. Especially, performance which cannot be attained by a passive anti-vibration apparatus can be obtained by positively applying feedforward control.

Not only in a passive anti-vibration apparatus but also in an active anti-vibration apparatus, when an X-Y stage mounted on an anti-vibration table moves in step-and-repeat or step-and-scan operation, the barycenter changes due to movement of the stage, and the anti-vibration table tilts. This tilt is eliminated after the elapse of a sufficient time. However, since the step-and-repeat or step-and-scan operation is performed at a high speed, the anti-vibration table cannot restore its position in time, and eventually, the anti-vibration table tilts. Although this tilt is an inevitable physical phenomenon, it is disadvantageous for a semiconductor exposure apparatus. For example, when a functional unit (not shown) in the main body structure vibrates due to a tilt of the main body structure, predetermined performance cannot be obtained. As a measure, the natural frequency of the anti-vibration table is raised, i.e., the anti-vibration table is made rigid to suppress response to disturbance. In this case, however, vibration from the floor is readily transmitted to the upper portion of the anti-vibration table, resulting in degradation in anti-vibration characteristics. With this background, a demand for a technique of correcting a tilt of the main body structure without degrading the anti-vibration characteristics has arisen.

To help understand this situation, the above contents will be described with reference to the mechanical arrangement of an active anti-vibration apparatus having an X-Y stage mounted on an anti-vibration table. FIG. 7 shows the schematic mechanical arrangement of an active anti-vibration apparatus. Referring to FIG. 7, reference numeral 21 denotes an X-Y stage mounted on an anti-vibration table 22; and 23-1, 23-2, and 23-3, active supports supporting the anti-vibration table 22. Each active support 23-$n$ (n=1, 2, 3) incorporates acceleration sensors AC, position sensors PO, pressure sensors PR, servo valves SV, and air spring actuators AS in number necessary for control in two axes, the vertical and horizontal directions. A suffix added to AC, PO, or the like represents direction (X,Y,Z) along the coordinate systems in FIG. 7 and the position of the active support 23-$n$ (n=1, 2, 3). For example, Y2 indicates an element arranged along the Y axis and incorporated in the active support 23-2 on the front left side of the page.

A detailed description of the structure will be omitted. A phenomenon that takes place when the Y stage of the X-Y stage 21 moves in the Y-axis direction in FIG. 7 by a certain distance and stops will be described. For the active supports 23-$n$, Y-axis movement of the Y stage changes the barycenter of the entire anti-vibration table. The thrusts to be generated by the vertical actuators AC-Zn (n=1, 2, 3) in the active supports 23-$n$, which are necessary to maintain the horizontal posture of the anti-vibration table 22, are uniquely determined. When the Y stage has moved and stopped, and a sufficient time has elapsed, thrusts corresponding to the change in barycenter are generated by the active supports 23-$n$ because of position control, and any tilt of the anti-vibration table 22 is removed. That is, the surface of the anti-vibration table 22 maintains its level. However, the situation changes when the Y stage continuously moves in the step-and-repeat or step-and-scan operation. When the Y stage continuously moves, the barycenter also continuously changes. Since the active supports 23-$n$ cannot return to predetermined positions in time, the anti-vibration table 22 gradually tilts. When the X stage moves in the step-and-repeat or step-and-scan operation, rotation (tilt) about the Y axis occurs due to the same reason as described above. Such tilt of the anti-vibration table 22 may degrade the measuring accuracy of a measuring device (not shown) or the position settling o-of the stage itself to lower the productivity of a semiconductor exposure apparatus. Under the circumstance, a demand for a technique of correcting a tilt of the anti-vibration table due to a change in barycenter upon movement of the stage has arisen.

As a prior art for solving the above problems, Japanese Patent Laid-Open No. 9-134876 (anti-vibration apparatus and exposure apparatus) is known. According to this prior art, a tilt of the anti-vibration table due to a change in barycenter upon movement of the stage is predicted on the basis of an output from a stage position detection means (laser interferometer), and a command value for correcting this tilt is feedforward-input to the vibration control system of the anti-vibration apparatus. A voice coil motor (VCM) is used as an actuator, through which a steady-state current for correcting any tilt of the anti-vibration table due to movement of the stage flows. As can be easily understood by those skilled in the art, supply of a steady-state current has the following shortcomings.

(1) The VCM driving power supply becomes bulky.
(2) The VCM and a power amplifier for driving the VCM generate heat.
(3) A cooling unit for removing heat from the VCM and power amplifier must be prepared.
(4) A humidity control apparatus for the entire semiconductor exposure apparatus becomes bulky.

Hence, it is preferable not to supply a DC current to a VCM for anti-vibration/vibration suppression of a large structure such as a semiconductor exposure apparatus. There are anti-vibration tables supporting a large structure without contact using an electromagnetic force. Such an anti-vibration table is disclosed in, e.g., Japanese Patent No. 2522736 (anti-vibration apparatus). However, this apparatus uses, as an actuator, an electromagnet as a magnetic bearing. This actuator normally steadily generates a force, and its use form cannot be put in the same category with that of the above-described VCM. A VCM is originally used by supplying a current to form a damping actuator for suppressing vibration of a mechanical structure. An air spring actuator capable of supporting a large mass by opening/closing a servo valve should be used for a work that requires a force. That is, a tilt of the anti-vibration table caused by moving load due to movement of the stage is preferably corrected by an air spring actuator. However, a technical problem still exists in realizing moving load correction. This is because an air spring actuator including a servo valve substantially has integral characteristics.

To help understand this further, an explanation will be given with reference to the drawings. FIG. 2 is a block diagram showing feedforward input to an astatic system. The astatic system represents integral characteristics 15 of an air spring actuator including a servo valve. Referring to FIG. 2, a correction signal corresponding to the stage position is input to a feedforward input terminal 14. When this signal is multiplied by an appropriate gain $k_p$ and feedforward-input, a mechanical system 16 of the anti-vibration table, i.e., a tilt of the anti-vibration table may seem to be correctable. However, since an air spring actuator including a servo valve substantially has integral characteristics, an actual driving force f obtained by feedforward-inputting the correction signal which linearly changes in accordance with the stage position is obtained by integrating the input correction signal. Apparently, a force for suppressing tilt of the anti-vibration table, which is proportional to the movement of the stage, cannot be generated. That is, with the arrangement for moving load correction as shown in FIG. 2, a tilt of the anti-vibration table cannot be corrected.

To generate a force corresponding to the stage moving position, the astatic system of the air spring actuator including a servo valve is changed to a static system. The static system represents characteristics 17 of, e.g., a system with time-lag of first order as shown in FIG. 3. With such characteristics, when a correction signal that linearly changes in accordance with the stage position is supplied to the feedforward input terminal 14, a driving force f corresponding to the stage position can be obtained. The time-lag of first order can be realized by pressure feedback to the servo valve substantially having the integral characteristics. The arrangement of pressure feedback is disclosed in Japanese Patent Application No. 9-68995 previously filed by the present applicant. However, this prior art aims at suppressing deformation of the main body structure. More specifically, it has a main object to prevent distortion of an exposure apparatus main body 13 by controlling the pressure of an air spring actuator. This prior art also discloses an arrangement for inputting so-called stage reaction force feedforward to an air spring actuator in the horizontal direction to suppress instantaneous swing due to acceleration/deceleration of the stage. The present invention provides not a control apparatus for suppressing such an instantaneous force but an apparatus arrangement for inputting feedforward input for suppressing a tilt of the anti-vibration table due to movement of the stage, or variation with a relatively low frequency, to an air spring actuator in the vertical direction. More specifically, the present invention provides an apparatus arrangement for correcting a tilt of the anti-vibration table effectively using pressure feedback described in Japanese Patent Application No. 9-68995 and on the basis of the stage moving position information.

In a semiconductor exposure apparatus, an X-Y stage that has large acceleration/deceleration is mounted on an active anti-vibration table. As the X-Y stage moves, the barycenter of the main body structure also moves. When this main body structure is supported by an active anti-vibration apparatus, the anti-vibration table is returned to a predetermined position by position control. However, when the moving amount of the X-Y stage is large, the moving time is short, and the movement is frequent, the anti-vibration table cannot return to the predetermined position in time and tilts as the X-Y stage moves at a high speed. A tilt of the anti-vibration table may vary the X-Y stage positioning characteristics in units of moving positions to lower the productivity.

SUMMARY OF THE INVENTION

It is an object of the present invention to solve the above problems.

It is another object of the present invention to effectively remove vibration by alleviating the influence of a change in barycenter according to movement of a stage.

In order to achieve the above object, according to the present invention, there is provided an anti-vibration apparatus for a structure having a movable stage, comprising damping means for controlling a fluid pressure to support the structure and remove vibration, first feedback means for performing feedback control using position information of the structure to generate a first driving signal for controlling the fluid pressure of the damping means, second feedback means for performing feedback control using fluid pressure information of the damping means to correct the first driving signal and generate a second driving signal for controlling the fluid pressure of the damping means, and correction means for generating a correction signal for correcting tilt of the structure on the basis of control information of the stage and feedforward-inputting the correction signal to the second feedback means.

An air spring is preferably used as the damping means. A pressure sensor for measuring the internal pressure of an actuator is preferably used as the second feedback means. A load sensor for detecting a load generated by an air spring actuator is also preferably used.

The natural period determined by the frequency band of the feedback loop formed by the second feedback means is preferably set to be shorter than the period of step-and-repeat or step-and-scan of the stage.

The stage control information used by the correction means is preferably information representing the position of the stage. To acquire the information representing the stage position, a laser interferometer used to position the stage, an encoder for switching the phase of a linear motor coil for driving the stage, or a dedicated position sensor can be used.

The above-described anti-vibration apparatus of the present invention can be applied to an exposure apparatus for, e.g., transferring a circuit pattern formed on a reticle onto a semiconductor wafer on an X-Y stage through a projection optical system.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is an explanatory view showing an example of step-and-repeat or step-and-scan;

DETAILED DESCRIPTION OF THE PREFERRED EMBODIMENT

Preferred embodiments of the present invention will now be described in detail in accordance with the accompanying drawings.

Figure 1:
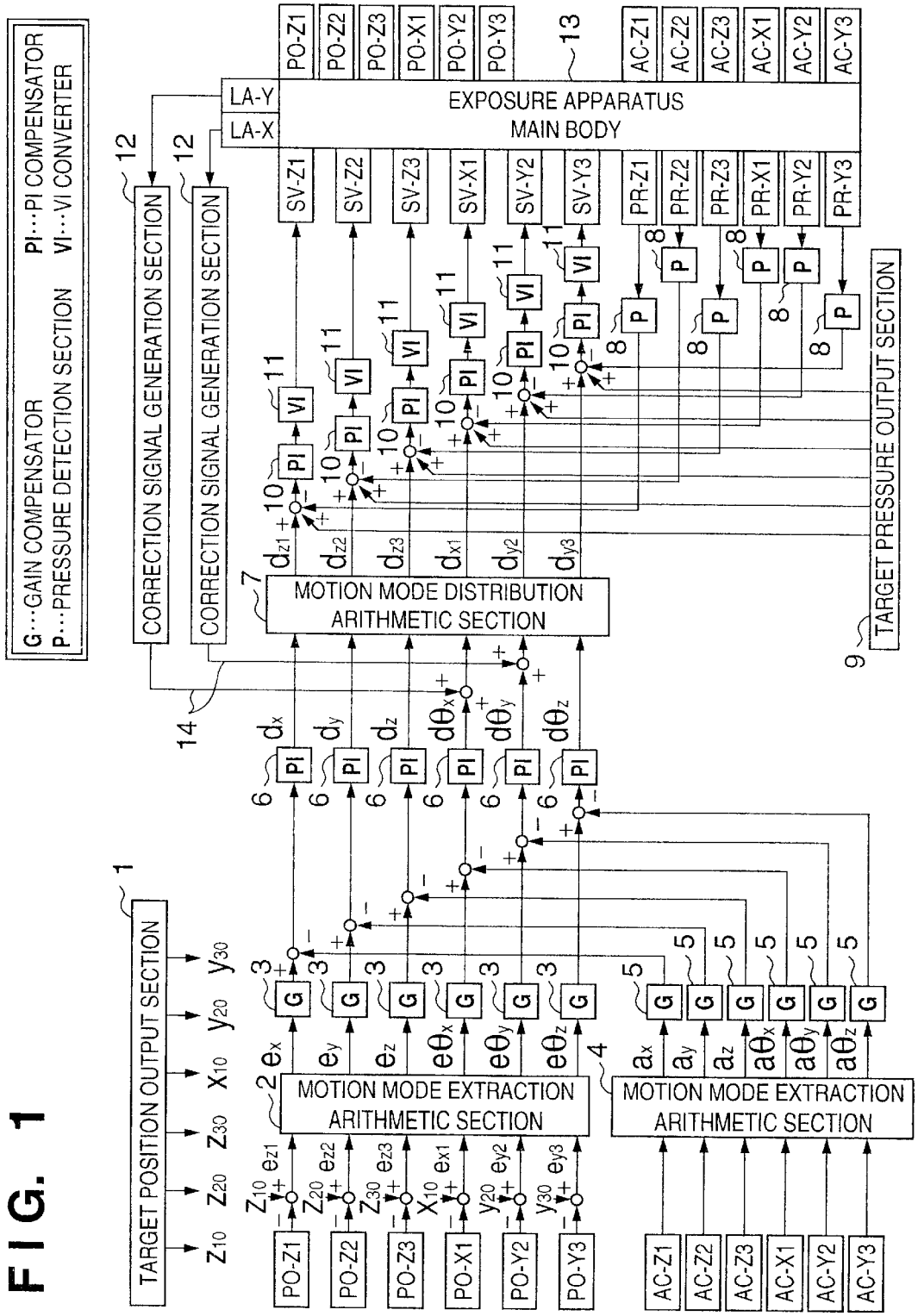
FIG. 1 is a block diagram showing the arrangement of an active anti-vibration apparatus according to an embodiment of the present invention.

FIG. 1 shows an active anti-vibration apparatus according to an embodiment of the present invention. Referring to FIG. 1, position sensors PO-Z1, PO-Z2, PO-Z3, PO-X1, PO-Y2, and PO-Y3 construct a position measuring system. Outputs from this system are compared to outputs ($z_{10}$, $z_{20}$, $z_{30}$, $x_{10}$, $y_{20}$, $y_{30}$) from a target position output section 1 to obtain position error signals ($e_{z1}$, $e_{z2}$, $e_{z3}$, $e_{x1}$, $e_{y2}$, $e_{y3}$) for the respective axes. These error signals are supplied to a motion mode extraction arithmetic section 2 associated with position signals, which calculates and outputs motion mode position error signals ($e_x$, $e_y$, $e_z$, $e\theta_x$, $e\theta_y$, $e\theta_z$) for a total of 6-degrees-of-freedom, i.e., translation motions and rotation motions about the axes of an anti-vibration table 22. These output signals are supplied to gain compensators 3 associated with position, which adjusts the position characteristics in units of motion modes with little interference (decoupling state). This loop is called a position feedback loop.

Outputs from acceleration sensors AC-Z1, AC-Z2, AC-Z3, AC-X1, AC-Y2, and AC-Y3 as representative building elements of a vibration measuring system are appropriately filtered to, e.g., remove high-frequency noise and immediately input to a motion mode extraction arithmetic section 4 associated with acceleration. The motion mode extraction arithmetic section 4 outputs motion mode acceleration signals ($a_x$, $a_y$, $a_z$, $a\theta_x$, $a\theta_y$, $a\theta_z$). To set optimum damping in units of motion modes, the motion mode acceleration signals ($a_x$, $a_y$, $a_z$, $a\theta_x$, $a\theta_y$, $a\theta_z$) are supplied to gain compensators 5 associated with acceleration signals. By adjusting the gains, optimum damping characteristics can be obtained in units of motion modes. This loop is called an acceleration feedback loop.

The outputs from the gain compensators 3 associated with position and negative feedback signals as outputs from the gain compensators 5 associated with acceleration are supplied to PI compensators 6 corresponding to the respective motion modes. P represents a proportional operation, and represents an integral operation. The reason why the PI compensators are arranged at this portion is described in detail in Japanese Patent Application No. 9-68995. This will be briefly described below, though a detailed description using mathematical expressions will be omitted.

A case without pressure feedback will be described. Acceleration is detected and multiplied by an appropriate gain. When the resultant value is fed back to the input side of a voltage/current converter for driving a servo valve, the manipulation amount acts as damping. Since an air spring actuator including a servo valve substantially has integral characteristics, the acceleration signal is integrated and has an effect as a velocity. However, when pressure feedback is performed, as will be described later, the integral characteristics change to a first order lag system. Even when acceleration feedback is performed for such a first order lag system, no damping effect can be obtained. To use acceleration gain feedback for damping, the integral characteristics are recovered. A compensator for this purpose is the PI compensator 6. Since the PI compensator 6 has perfect integral characteristics as a compensator, positioning can be performed with zero steady position error even when the above-described position feedback loop incorporates no integrator. Hence, a gain compensator 3 is used as a compensator of this loop.

Motion mode driving signals ($d_x$, $d_y$, $d_z$, $d\theta_x$, $d\theta_y$, $d\theta_z$) are input to a motion mode distribution arithmetic section 7. Outputs from the motion mode distribution arithmetic section 7 are driving signals ($d_{z1}$, $d_{z2}$, $d_{z3}$, $d_{x1}$, $d_{y2}$, $d_{y3}$) to be generated by air spring actuators of the respective axes. The systems to be driven by the driving signals ($d_{z1}$, $d_{z2}$, $d_{z3}$, $d_{x1}d_{y2}$, $d_{y3}$) form independent pressure feedback loops in units of axes, as disclosed in Japanese Patent Application No. 9-68995. More specifically, outputs from pressure measuring systems PR-Z1, PR-Z2, PR-Z3, PR-X1, PR-Y2, and PR-Y3 represented by pressure sensors for measuring the internal pressures of air spring actuators are negatively fed back by pressure detection sections 8 as electrical signals. Signals from a target pressure output section 9 and the above-described driving signals ($d_{z1}$, $d_{z2}$, $d_{z3}$, $d_{x1}$, $d_{y2}$, $d_{y3}$) for the respective axes are added and supplied to PI compensators 10 associated with pressures. Outputs from the PI compensators 10 drive voltage/current converters (abbreviated as VI converters in FIG. 1) 11 for flowing currents to servo valves SV-Z1, SV-Z2, SV-Z3, SV-X1, SV-Y2, and SV-Y3 of the respective axes to open/close the valves. The target pressure output section 9 designates equilibrium state pressure values generated by the air spring actuators of the respective axes. This loop is called a pressure feedback loop. In the pressure feedback loop, the internal pressures of the air spring actuators are detected by the pressure measuring systems PR represented by pressure sensors and fed back. Even when loads generated by the air spring actuators are detected by load measuring systems represented by load sensors and negatively fed back to form a load feedback loop, the same function as the pressure feedback loop can be realized. The pressure measuring system and load measuring system combined are called an applied pressure measuring system. The pressure feedback loop and load feedback loop combined are called an applied pressure feedback loop. In this specification, the technical contents will be described using a pressure feedback loop in such an applied pressure feedback loop.

Figure 2:
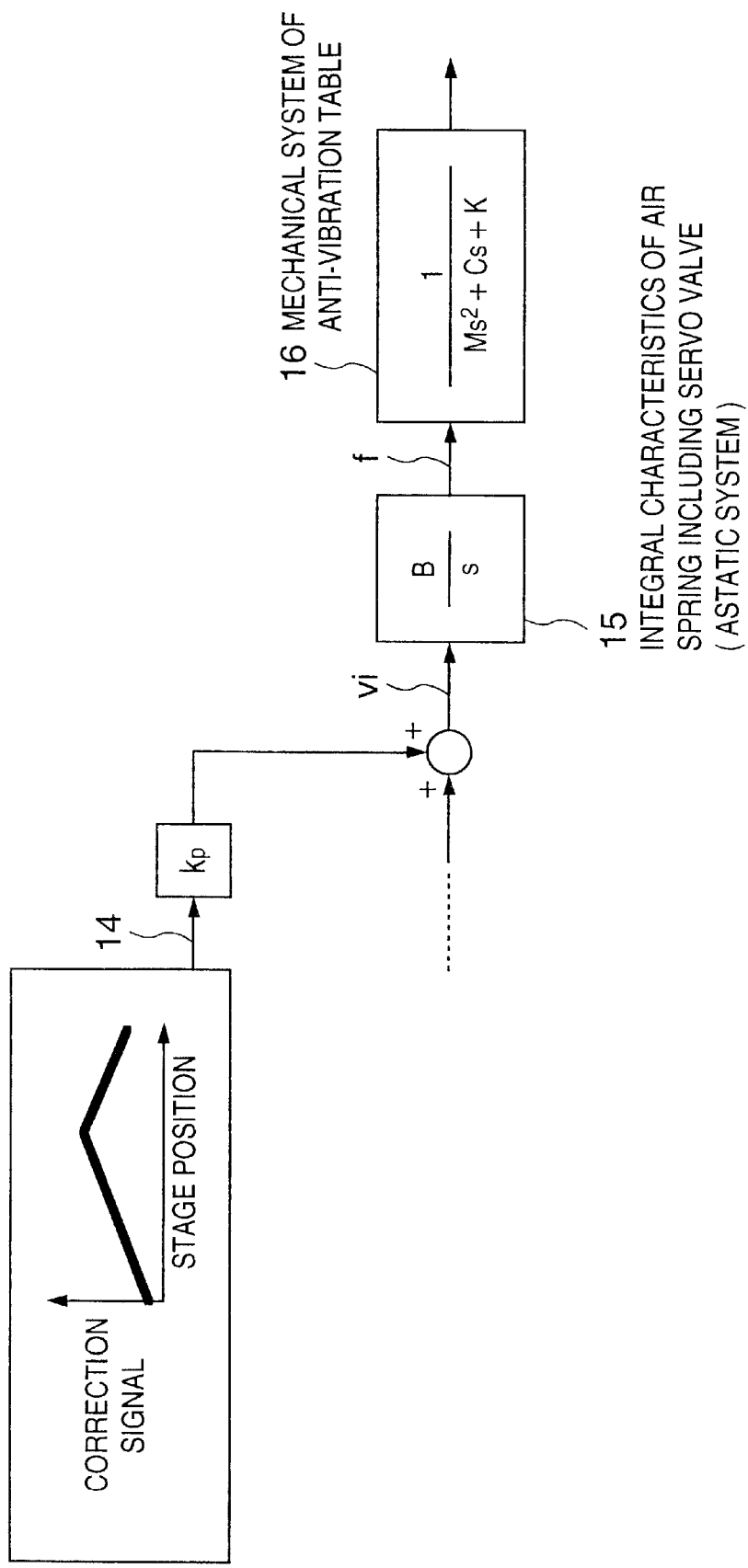
FIG. 2 is an explanatory view showing feedforward input to an astatic system.
Figure 7:
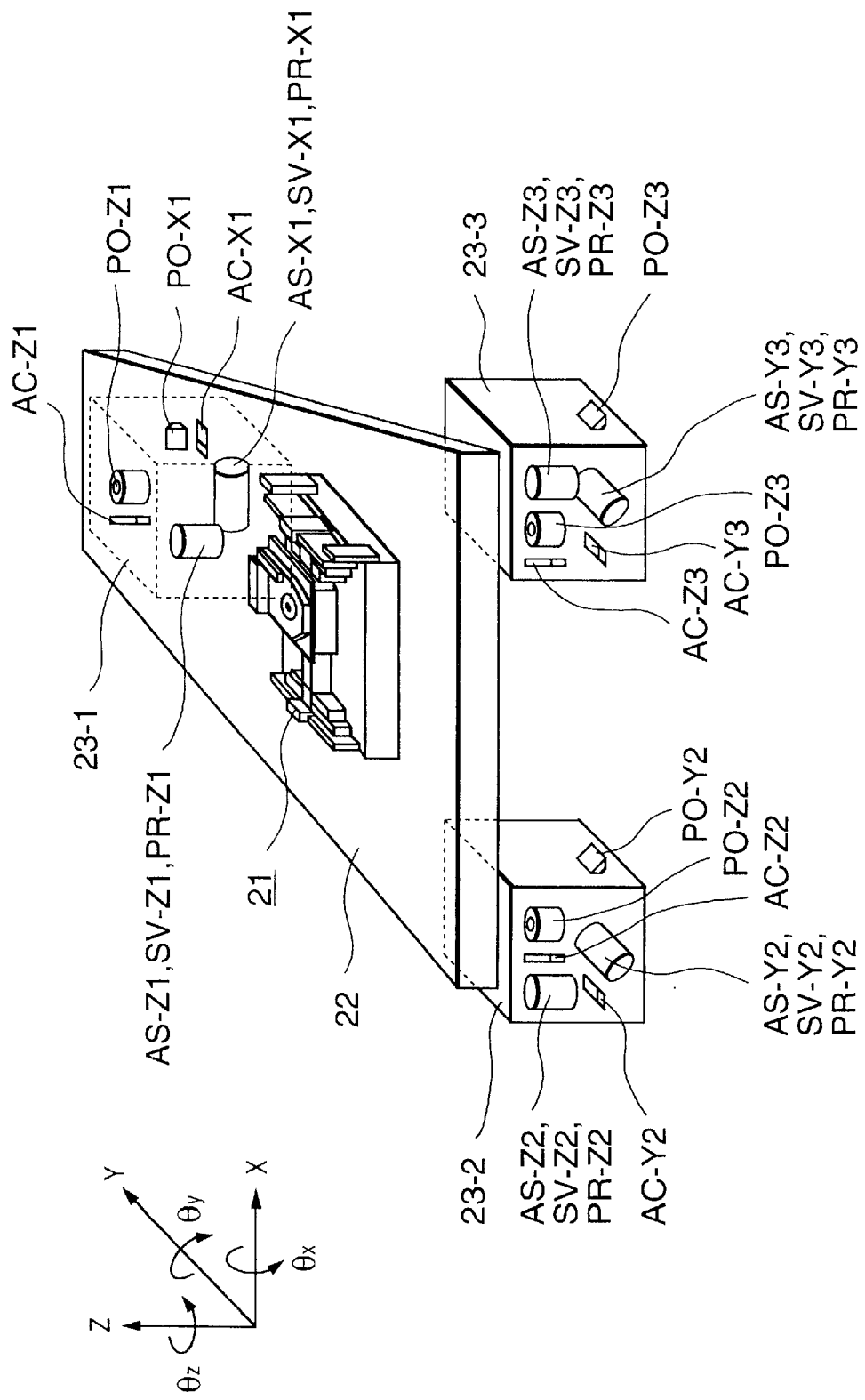
FIG. 7 is a perspective view showing the mechanical arrangement of an active anti-vibration apparatus.

An apparatus arrangement for suppressing a tilt of the anti-vibration table 22 due to movement of the X-Y stage will be described next. Laser interferometers LA-X and LA-Y shown in FIG. 1 serve as position detection systems for positioning an X-Y stage 21 and are attached to an exposure apparatus main body 13 having an active anti-vibration apparatus shown in FIG. 7 as a unit. When the X-Y stage moves in the X-axis direction, rotation (tilt) about the Y axis is generated in the anti-vibration table. When the X-Y stage moves in the Y-axis direction, rotation (tilt) about the X axis is generated. The moving amount in the X- or Y-axis direction is proportional to the tilt amount. Hence, a tilt of the anti-vibration table due to movement of the X-Y stage can be suppressed by generating a driving force proportional to the moving amount of the X-Y stage. More specifically, when a driving force proportional to the moving amount of the X-Y stage can be linearly generated by air spring actuators supported in the vertical direction, a tilt of the anti-vibration table can be suppressed. Taking this into consideration, an output signal from the laser interferometer LA-Y of the Y axis is input to a correction signal generation section 12, so a correction signal proportional to the moving distance along the Y axis is generated. The output from the correction signal generation section 12 is added to the portion $d\theta_x$ where a rotation driving signal about the X axis is generated. Similarly, an output from the laser interferometer LA-X of the X axis is supplied to a correction signal generation section 12, and a correction voltage proportional to the moving amount along the X axis is generated. The output voltage is added to the portion $d\theta_y$ where a rotation driving signal about the Y axis is generated. To cause the air spring actuator to generate a force linear to the sum signal, the characteristics until a voltage $v_i$ [V] is input to the voltage/current converter 11, and a driving force f [N] is generated are important. Without pressure feedback, the characteristics are the same as those of an astatic system 15 in FIG. 2 and are represented by:

$$\frac{f}{v_i} = \frac{B}{s} \quad (1)$$

where s is the Laplace operator, and B [N/Vsec] is the pressure time constant gain.

Figure 3:
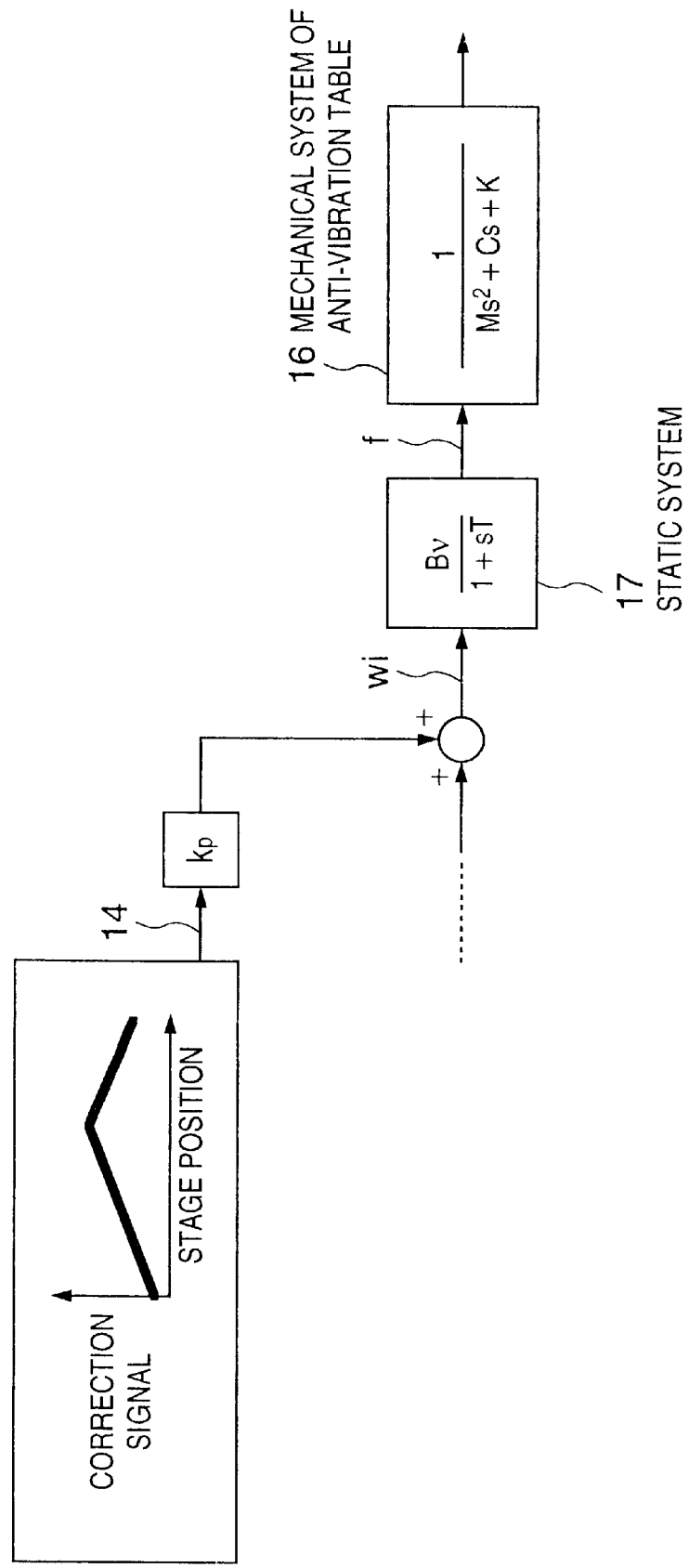
FIG. 3 is an explanatory view showing feedforward input to a static system.

On the other hand, with pressure feedback, referring to FIG. 1, the signal from the pressure measuring system PR is converted into an electrical signal by the pressure detection section 8, and the electrical signal is fed back to the input side of the PI compensator 10 before the voltage/current converter 11. When appropriate parameters are set for the PI compensator 10, the characteristics from a new input $w_i$ [V] to this system to the driving force f can be described as a system with time-lag of first order like a static system 17 shown in FIG. 3 and represented by:

$$\frac{f}{w_i} = \frac{B_v}{1+sT} \quad (2)$$

where $B_v$ [N/V] is the pressure gain, and T [sec] is a time constant.

When $w_i = w_{i0}/s$, and a stepwise signal is supplied, a final value $f\infty$ is given by $$f\infty = B_v w_{i0} = \text{constant} \quad (3)$$

In equation (1) for the astatic system without pressure feedback, evidently the driving force f diverges with respect to the stepwise signal input (in fact, since the system forms no perfect integrator and has low-pass filter characteristics having the breakpoint at a very low frequency, the driving force f stabilizes at a steady value after the elapse of a sufficient time). More specifically, in the astatic system without pressure feedback, even when a correction signal corresponding to the moving position of the X-Y stage is supplied to the input side of the voltage/current converter 11 for driving the servo valve, an appropriate driving force f for correction cannot be generated.

Figure 5:
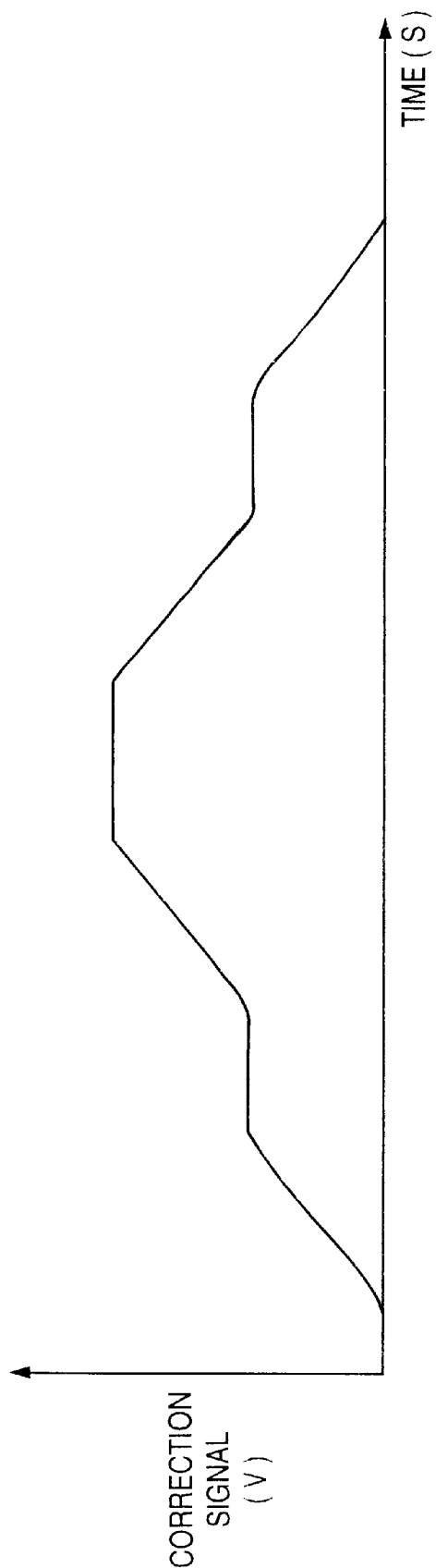
FIG. 5 is a graph showing a correction signal during step-and-repeat or step-and-scan shown in FIG. 4.

The above description exemplifies a case wherein the X-Y stage stands still at a given moving position for a certain time, and a correction signal is supplied to the air spring actuator. However, the X-Y stage of a semiconductor exposure apparatus (stepper) performs intermittent driving called step-and-scan. FIG. 4 shows an example of step-and-repeat or step-and-scan. Referring to FIG. 4, reference numeral 18 denotes a semiconductor wafer; 19, a shot region to be exposed; and 20, a moving direction. When the X-Y stage moves in this way, rotation $\theta_x$ about the X axis in the coordinate system in FIG. 4 is generated to tilt the anti-vibration table. FIG. 5 shows a waveform representing the moving distance in the Y-axis direction and serving as a correction signal for correcting $\theta_x$. That is, the correction signal has an almost ramp-shaped waveform with a gradient over time.

Figure 6:
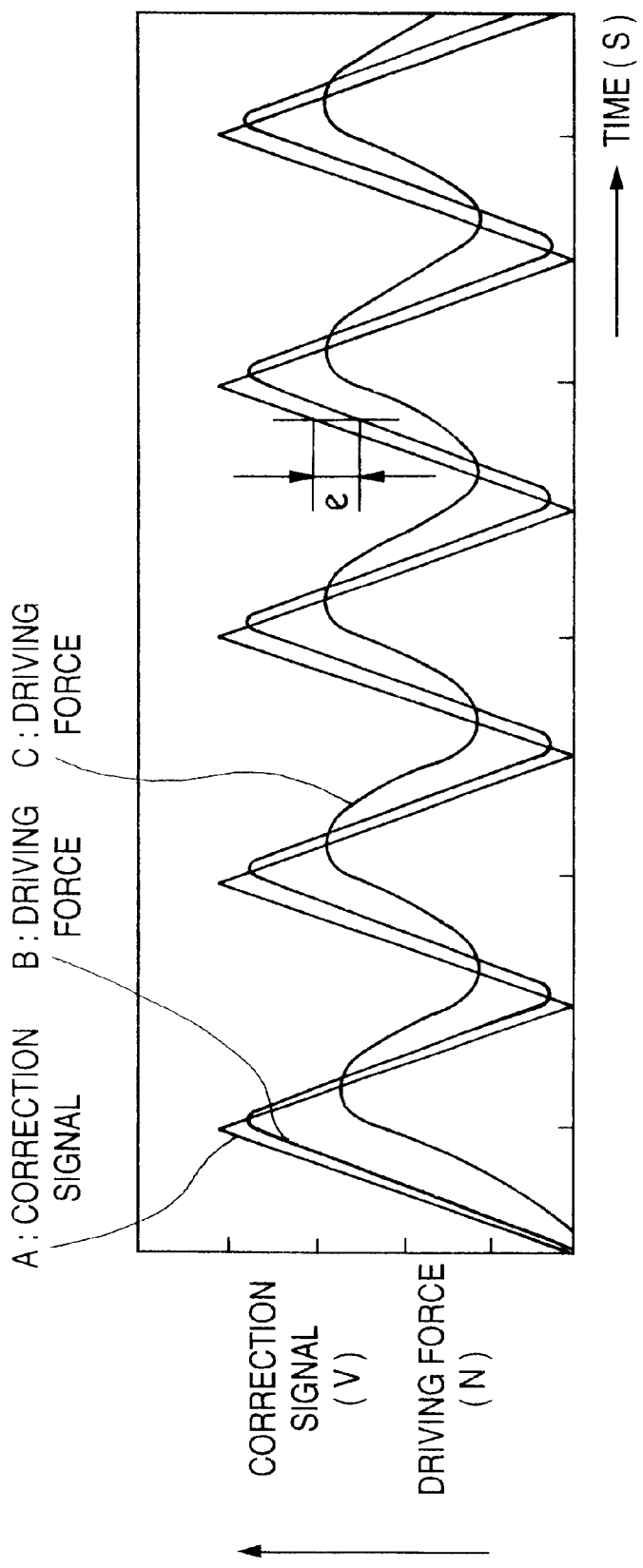
FIG. 6 is a graph showing the relationship between the correction signal and the driving force.

FIG. 6 shows the driving force f generated when a correction signal A having a triangular waveform formed by repeating the ramp-shaped waveform is input to a pressure feedback system whose time constant T in equation (2) is different. The time constant T of the pressure feedback system when a driving force B is obtained is smaller than that for a driving force C. More specifically, when a pressure feedback system having a shorter time constant T than the period of the correction signal A is formed, a driving force f which tracks the correction signal A to some extent can be obtained. From the above description, to properly correct a tilt of the anti-vibration table, the natural period determined by the frequency band of the pressure feedback system must be shorter than the period of step-and-repeat or step-and-scan of the stage. However, as is apparent from comparison between A and B, even when the time constant T is small, an error e remains. This is because the pressure feedback system is of type 1. As is known, an error remains if a ramp-shaped waveform is input to a type-1 system. That is, a tracking error such as error e remains in principle. However, when a driving force f tracing the ramp-shaped correction signal is generated, a tilt of the anti-vibration table can be eventually corrected to a large extent as compared to a case wherein no correction signal is supplied. More specifically, in control theory, a tracking error inevitably remains in a type-1 pressure feedback system for a ramp input, and this must be taken into consideration if given tracking performance is to be obtained. However, to correct a tilt of the anti-vibration table, it suffices that a driving force f tracing the waveform of the correction signal is generated. That is, as compared to a case wherein no correction signal is supplied, a tilt of the anti-vibration table can be largely corrected.

To completely track the correction signal, the VCM is actuated to eliminate the residual tracking error e with reference to FIG. 6. For this purpose, the anti-vibration apparatus must be a hybrid active anti-vibration apparatus in which both air spring actuators and VCMs are appropriately arranged, though the VCMs are not illustrated in FIG. 7. In this arrangement, most moving load is corrected by the force of the air spring actuators, and moving load generated by the type-1 pressure feedback system, which cannot be completely corrected, is corrected with the help of the VCMs. As compared to a case wherein the entire moving load is corrected by the VCMs, little heat is generated when the VCMs are used to eliminate the tracking error e.

To completely track the substantially ramp-shaped correction signal, the fact that the driving pattern of step-and-repeat or step-and-scan is known in advance can be used. That is, a correction signal is applied to eliminate any predicted tracking error e with reference to FIG. 6. With this arrangement, a tilt of the anti-vibration table can be corrected beforehand on the basis of a driving file known in advance.

In the above description, the signals to be supplied to the correction signal generation sections 12 are output from positioning detection systems for the X-Y stage, and more specifically, laser interferometers. However, when the actuator for driving the X-Y stage is formed from, e.g., a polyphase DC linear motor, it generally has an encoder for switching the coil phase. That is, the output signal from this encoder can be supplied to the correction signal generation section 12 to generate a correction signal for correcting a tilt of the anti-vibration table due to high-speed movement or high-speed scanning of the X-Y stage. The position detection system for positioning the X-Y stage is not limited to the laser interferometer or the encoder for switching the coil phase, and any other means can be used as long as it measures the moving position of the X-Y stage. For example, to generate a signal for correcting a tilt of the anti-vibration table, a special position sensor for detecting the position of the X-Y stage may be used.

Referring to FIG. 1, non-interference control systems for the respective motion modes (motion mode decoupling system), which have the motion mode extraction arithmetic section 2 associated with positions, motion mode extraction arithmetic section 4 associated with accelerations, and motion mode distribution arithmetic section 7, are formed in the control loop. With this control structure, when the correction signal for correcting a tilt of the anti-vibration table is superposed on those portions of driving signals which represent the motion modes, a driving force is generated by collaboration of the plurality of active supports to correct a tilt of the anti-vibration table. That is, the fact that the control loop structures are formed in units of motion modes greatly contributes in correcting a tilt of the anti-vibration table due to movement of the X-Y stage.

Finally, redundancy of the position sensor, acceleration sensor, and air spring actuator will be described. A rigid object has three translation motions and three rotation motions, i.e., six-degrees-of-freedom. Hence, the minimum necessary numbers of sensors or actuators is 6. In the active anti-vibration apparatus shown in FIG. 1, a minimum necessary number of position sensors and acceleration sensors are prepared to detect the motion mode of the rigid object. The number of various sensors can be changed without departing from the spirit and scope of the present invention. For example, to detect and positively control soft motion modes as well as rigid motion modes, the number of sensors or actuators must be increased. In this case as well, the loop structure for each motion mode of the active anti-vibration apparatus shown in FIG. 1 does not change.

An embodiment of a device production method using an exposure apparatus having the above-described active anti-vibration apparatus will be described next.

Figure 8:
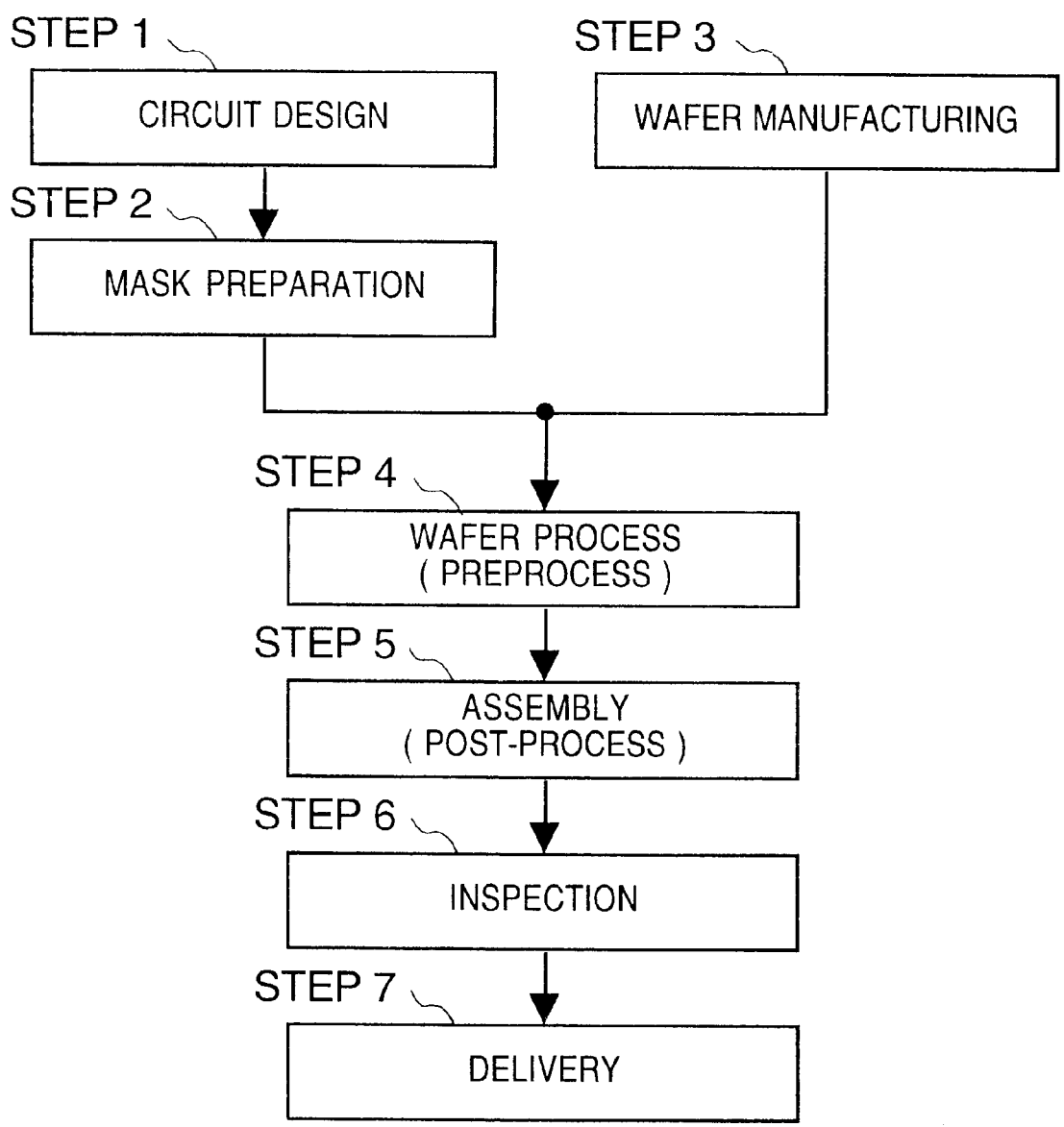
FIG. 8 is a flow chart showing the flow of manufacturing a microdevice.

FIG. 8 shows the flow of manufacturing a microdevice (e.g., a semiconductor chip such as an IC or an LSI, a liquid crystal panel, a CCD, a thin-film magnetic head, or a micromachine). In step 1 (circuit design), the pattern of a device is designed. In step 2 (mask preparation), a mask having the designed pattern is prepared. In step 3 (wafer manufacturing), a wafer is manufactured using a material such as silicon or glass. In step 4 (wafer process) called a preprocess, an actual circuit is formed on the wafer by lithography using the prepared mask and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and delivered (step 7).

Figure 9:
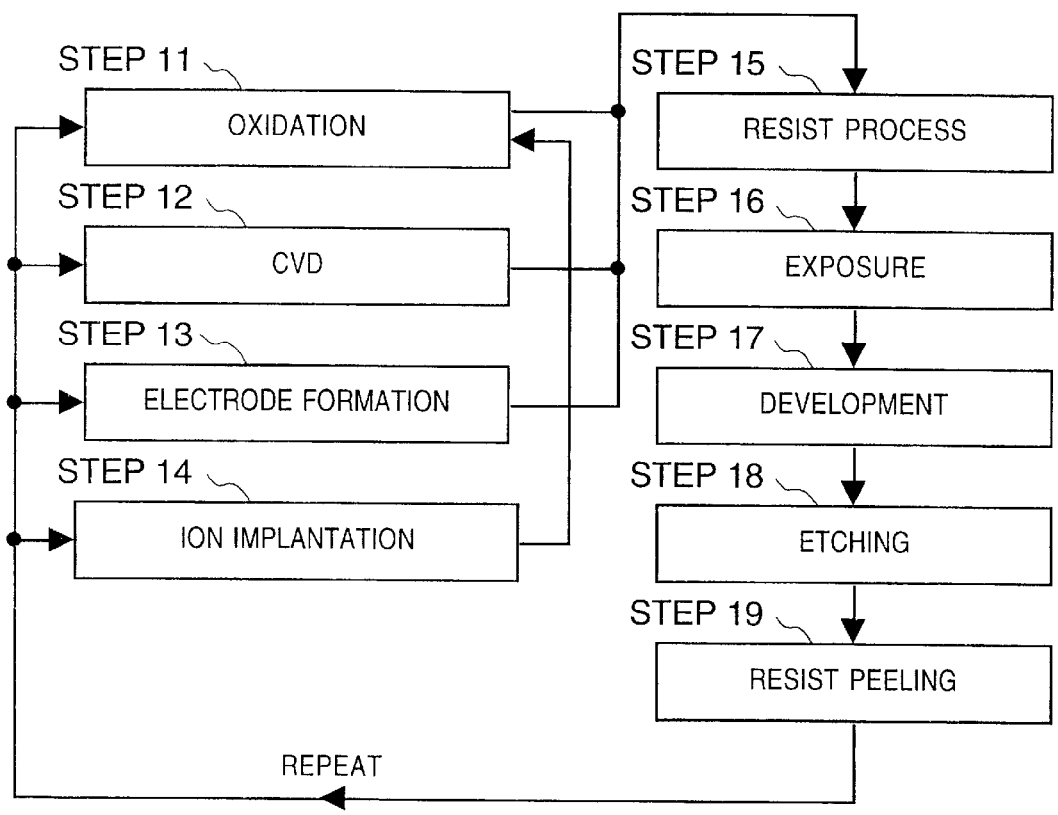
FIG. 9 is a flow chart showing the detailed flow of a wafer process shown in FIG. 8.

FIG. 9 shows details of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the circuit pattern of the mask is printed on the wafer by exposure using an exposure apparatus having the above-described active anti-vibration apparatus. In step 17 (development), the exposed wafer is developed. In step 18 (etching), portions other than the developed resist image are etched. In step 19 (resist peeling), the resist unnecessary after etching is removed. By repeating these steps, a multilayered structure of circuit patterns is formed on the wafer.

When the production method of this embodiment is used, a device with high degree of integration, which is conventionally difficult to manufacture, can be manufactured at low cost.

The effects of the present invention are as follows.
(1) Any tilt of the anti-vibration table due to a change in barycenter by high-speed movement of the stage can be suppressed or reduced.
(2) Conventionally, to correct a tilt of the anti-vibration table using an electromagnetic motor, a current must be continuously supplied. Hence, not only measures against heat generation by the electromagnetic motor itself but also measures associated with air conditioning must be sufficiently taken. On the other hand, in the present invention, a tilt of the anti-vibration table is corrected by driving a servo valve which generates little heat as compared to the electromagnetic motor, and no problem of heat generation is posed.
(3) Even when the stage continuously moves at a high speed, a tilt of the anti-vibration table is corrected to almost zero. Hence, disturbance caused by a tilt of the anti-vibration table does not act on the stage. That is, stable positioning or scanning performance can always be obtained independently of the moving position of the stage.
(4) The productivity is further increased.

As many apparently widely different embodiments of the present invention can be made without departing from the spirit and scope thereof, it is to be understood that the invention is not limited to the specific embodiments thereof except as defined in the appended claims.

What is claimed is:
1. An anti-vibration apparatus for a structure having a movable stage, comprising:
    damping means for controlling a fluid pressure to support the structure and remove vibration;
    first feedback means for performing feedback control using position information of the structure to generate a first driving signal for controlling the fluid pressure of said damping means;
    second feedback means for performing feedback control using fluid pressure information of said damping means to correct the first driving signal and generate a second driving signal for controlling the fluid pressure of said damping means; and
    correction means for generating a correction signal for correcting tilt of the structure on the basis of control information of the stage and feedforward-inputting the correction signal to said second feedback means.

2. The apparatus according to claim 1, wherein
said apparatus further comprises stage driving means for driving the stage, and
said correction means obtains the correction signal on the basis of a signal used by said stage driving means to control drive of the stage.

3. The apparatus according to claim 2, wherein
said correction means obtains the correction signal on the basis of an output signal from a laser interferometer used by said stage driving means to detect a position of the stage.

4. The apparatus according to claim 2, wherein
said correction means obtains the correction signal on the basis of an output signal from an encoder used by said stage driving means to control a motor for moving the stage.

5. The apparatus according to claim 1, wherein
the first driving signal generated by said first feedback means contains driving component signals in an axial direction and in a rotational direction about an axis, and
said correction means corrects the driving component signal in the rotational direction using the correction signal.

6. The apparatus according to claim 1, wherein
a time constant of a feedback system in said second feedback means is shorter than a period of step-and-repeat or step-and-scan of the stage.

7. The apparatus according to claim 1, wherein
a time constant of a feedback system in said second feedback means is shorter than a period of the correction signal generated by said correction means.

8. The apparatus according to claim 1, wherein
said first feedback means generates the first driving signal to position the structure at an equilibrium position by feedback control using information associated with a position of the structure.

9. The apparatus according to claim 7, wherein
said first feedback means comprises a feedback system for positioning the structure at an equilibrium position using information associated with a position of the structure, and a feedback system for imparting damping characteristics to said damping means using information associated with an acceleration of the structure, and the first driving signal is generated by said feedback systems.

10. The apparatus according to claim 1, wherein
said damping means comprises an air spring, and
the fluid pressure information is an output signal from a pressure sensor for measuring an internal pressure of an actuator of said air spring.

11. The apparatus according to claim 1, wherein
said damping means comprises an air spring, and
the fluid pressure information is an output signal from a load sensor for detecting a load generated by an actuator of said air spring.

12. An anti-vibration method using damping means for supporting a structure having a movable stage and controlling a fluid pressure to remove vibration, comprising:
the first feedback step of performing feedback control using position information of the structure to generate a first driving signal for controlling the fluid pressure of said damping means;
the second feedback step of performing feedback control using fluid pressure information of said damping means to correct the first driving signal and generate a second driving signal for controlling the fluid pressure of said damping means; and
the correction step of generating a correction signal for correcting tilt of the structure on the basis of control information of the stage and feedforward-inputting the correction signal to the second feedback step.

13. The method according to claim 12, wherein
the correction step comprises obtaining the control information on the basis of a signal used by a stage driving means to control drive of the stage.

14. The method according to claim 13, wherein
the correction step comprises obtaining the correction signal on the basis of an output signal from a laser interferometer used by said stage driving means to detect a position of the stage.

15. The method according to claim 13, wherein
the correction step comprises obtaining the correction signal on the basis of an output signal from an encoder used by said stage driving means to control a motor for moving the stage.

16. The method according to claim 12, wherein
the first driving signal generated in the first feedback step contains driving component signals in an axial direction and in a rotational direction about an axis, and
the correction step comprises correcting the driving component signal in the rotational direction using the correction signal.

17. The method according to claim 12, wherein
a time constant of a feedback system in the second feedback step is shorter than a period of step-and-repeat or step-and-scan of the stage.

18. The method according to claim 12, wherein
a time constant of a feedback system in the second feedback step is shorter than a period of the correction signal generated in the correction step.

19. The method according to claim 12, wherein
the first feedback step comprises generating the first driving signal to position the structure at an equilibrium position by feedback control using information associated with a position of the structure.

20. The method according to claim 18, wherein
the first feedback step comprises feedback processing for positioning the structure at an equilibrium position using information associated with a position of the structure, and feedback processing for imparting damping characteristics to said damping means using information associated with an acceleration of the structure, and the first driving signal is generated by the feedback processing.

21. An exposure apparatus comprising:
a stage on which a material to be exposed is placed and is movable in accordance with exposure operation;
a structure having said stage;
damping means for controlling a fluid pressure to support said structure and remove vibration;
first feedback means for performing feedback control using position information of said structure to generate a first driving signal for controlling the fluid pressure of said damping means;
second feedback means for performing feedback control using fluid pressure information of said damping means to correct the first driving signal and generate a second driving signal for controlling the fluid pressure of said damping means; and
correction means for generating a correction signal for correcting tilt of said structure on the basis of control information of said stage and feedforward-inputting the correction signal to said second feedback means.

* * * * *

UNITED STATES PATENT AND TRADEMARK OFFICE
CERTIFICATE OF CORRECTION

PATENT NO. : 6,213,443 B1
DATED : April 10, 2001
INVENTOR(S) : Shinji Wakui

It is certified that error appears in the above-identified patent and that said Letters Patent is hereby corrected as shown below:

Title page,
Item [56], References Cited, "8-2522736 5/1996 (JP)." should be deleted; and "9015868" should read -- 9-015868 --.

Column 1,
Line 33, "are" should read -- have been --.
Line 34, "A;" should be deleted.

Column 2,
Line 7, "number" should read -- numbers --.
Line 39, "o-of" should read -- of --.

Column 6,
Line 3, "represents" should read -- I represents --.
Line 33, "$d_{x1}d_{y2}$" should read -- $d_{x1}$, $d_{y2}$ --.

Column 9,
Line 45, "numbers" should read -- number --.

Signed and Sealed this

Twenty-second Day of January, 2002

Attest:

JAMES E. ROGAN
*Director of the United States Patent and Trademark Office*

*Attesting Officer*